(12) United States Patent
Shih et al.

(10) Patent No.: US 6,599,838 B1
(45) Date of Patent: Jul. 29, 2003

(54) METHOD FOR FORMING METAL FILLED SEMICONDUCTOR FEATURES TO IMPROVE A SUBSEQUENT METAL CMP PROCESS

(75) Inventors: Tsu Shih, Hsin Chu (TW); Sung-Ming Jang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/188,442

(22) Filed: Jul. 2, 2002

(51) Int. Cl.[7] ................ H01L 21/4763; H01L 21/44; H01L 21/302
(52) U.S. Cl. ............ 438/692; 438/623; 438/624; 438/634; 438/687; 438/738
(58) Field of Search .................. 438/631, 626, 438/687, 690–693, 623, 624, 634, 636, 638–639, 645, 735, 738, 740

(56) References Cited

U.S. PATENT DOCUMENTS 4,361,638 A * 11/1982 Higashi et al.
5,698,901 A * 12/1997 Endo
6,140,224 A * 10/2000 Lin
6,184,572 B1 * 2/2001 Mountsier et al.
6,197,688 B1 * 3/2001 Simpson
6,331,479 B1 * 12/2001 Li et al.

* cited by examiner

Primary Examiner—Ha Tran Nguyen
(74) Attorney, Agent, or Firm—Tung & Associates

(57) ABSTRACT

A method for forming a metal filled semiconductor feature including a low dielectric constant CMP polishing stop layer for improving a CMP polishing process including providing a semiconductor processing surface having a anisotropically etched semiconductor feature formed through a thickness including a second dielectric insulating layer overlying a first dielectric insulating layer, the second dielectric insulating layer having a CMP material removal rate in a CMP process less than about ½ of a CMP material removal rate of the first dielectric insulating layer in the CMP process; filling the anisotropically etched semiconductor feature with a metal to form a metal filled semiconductor feature; and, planarizing according to the CMP process excess material including the metal overlying the second dielectric insulating layer.

20 Claims, 2 Drawing Sheets

METHOD FOR FORMING METAL FILLED SEMICONDUCTOR FEATURES TO IMPROVE A SUBSEQUENT METAL CMP PROCESS

FIELD OF THE INVENTION

This invention generally relates to the formation of metal filled semiconductor features and more particularly to a method for forming metal filled semiconductor features to improve a subsequent metal CMP process to avoid CMP underpolishing or CMP overpolishing.

BACKGROUND OF THE INVENTION

Multi-level metallization is one of the key technologies for the next generation of ultra large scale integration (ULSI). The multilevel interconnects providing electrical interconnection between various portions of a semiconductor device that form the basis of this technology require increasingly complicated manufacturing processes to avoid new problems engendered by the adoption of new manufacturing processes driven by the goals of reliability, low resistance and low capacitance electrical properties, and structurally stable semiconductor features. Many of the interconnect features include high aspect ratio apertures, including contact holes, vias, metal interconnect lines (trench lines) and other features. Also included are features having larger dimensions including trench lines and bonding pads. Reliable formation of these interconnect features including structural stability when exposed to various processing steps is critical to the formation of reliable semiconductor devices.

Copper and copper alloys have become the metal of choice for forming many interconnect features on semiconductor substrates. Copper and its alloys have lower resistivity and higher electromigration resistance compared to other metals such as, for example, aluminum. These characteristics are critical for achieving higher current densities including increased device speed.

Electroplating (electrodeposition) or electroless plating, particularly with respect to copper containing semiconductor features are being established as preferable methods for filling semiconductor device metal interconnect features to form structures including vias trench lines, and bonding pads. Typically, electroplating uses a suspension of positively charged ions of deposition material, for example metal ions, in contact with a negatively charged substrate, as a source of electrons, to deposit (plate out) the metal ions onto the charged substrate, for example, a semiconductor wafer. A thin metal layer (seed layer) is first deposited on the semiconductor wafer and within etched features to provide an electrical path across the surfaces. An electrical current is supplied to the seed layer whereby the semiconductor wafer surface is electroplated with an appropriate metal, for example, aluminum or copper.

One exemplary process for forming a series of interconnected multiple layers, for example, is a damascene process. Although there are several different manufacturing methods for manufacturing damascene structures, all such methods employ a series of photolithographic masking and etching steps, typically including a reactive ion etch (RIE). In the typical multilayer semiconductor manufacturing process, for example, a series insulating layers are deposited to include a series of interconnecting metallization structures such as vias and metal line interconnects (trench lines) to electrically interconnect areas within the multilayer device and bonding pads to interconnect the various devices on the chip surface or to interconnect the device to a semiconductor packaging frame. For example, pluralities of vias are separated from one another along the semiconductor wafer and selectively interconnect conductive regions between layers of a multi layer device. Metal interconnect lines (trench lines) typically serve to selectively interconnect conductive regions within a layer of a multilayer device.

In forming a typical metal interconnect feature, feature openings are etched into one or more insulating layers and are back-filled with metal, for example copper. The insulating layers (IMD layers) are typically a low-k (low dielectric constant) insulating material which reduces signal delay times caused by parasitic capacitance. The process by which feature openings are selectively etched into the insulating layers is typically a photolithographic patterning process, followed by a reactive ion etch (RIE) process, both of which are commonly known in the art.

In filling the semiconductor feature openings with metal, for example, copper, electroplating is a preferable method to achieve superior step coverage of etched features. The method generally includes first depositing a barrier/adhesion layer, for example, tantalum nitride over the etched feature opening surfaces, depositing a metal seed layer, for example copper, over the barrier/adhesion layer by physical vapor deposition (PVD) or chemical vapor deposition (CVD), followed by electroplating a metal, for example copper, over the seed layer to fill the etched features. The excess electroplated copper overlying the features is then removed according to a planarization process, for example, by chemical mechanical polishing (CMP), to define an electrically conductive interconnect feature.

One problem with the prior art metal filled semiconductor feature formation process, for example including copper filled features, includes the copper CMP planarization process which is carried out subsequent to copper filling the semiconductor feature, for example by electroplating. During a typical copper CMP process the excess copper overlying an IMD layer including a dielectric anti-reflectance coating (DARC), for example silicon oxynitride, and a barrier/adhesion layer, for example tantalum nitride, are removed. During the process, due to the relatively thin layers and high polishing rate (material removal rate) of the DARC layer and barrier/adhesion layer, for example, about 1000 Angstroms/min, it is frequently difficult to control the endpoint in the CMP process and therefore to control the final thickness of the copper filled semiconductor feature. In competing processing goals, it is important to completely remove the dielectric layers, for example, the DARC layer and the barrier adhesion layer overlying the IMD layer to reduce contributions to overall capacitance in a multi-level device while avoiding overpolishing to ensure the manufacture of metal filled semiconductor features within design specifications.

For example, in an exemplary damascene structure manufacturing process according to the prior art, referring to FIG. 1A is shown a portion of a multi-level semiconductor device including a dielectric insulating layer 12, also referred to as inter-metal dielectric (IMD) layer, for example, having dielectric constant less than about 3.0, for example fluorinated silica glass (FSG). Overlying the IMD layer, a DARC layer 16, formed of, for example, silicon oxynitride (SiON), is typically formed over the IMD layer 12 to reduce undesired light reflections in a subsequent photolithographic patterning process to define a feature opening for anisotropic etching.

Referring to FIG. 1B, feature opening 14 is anisotropically etched following photolithographic patterning of an overlying photoresist layer (not shown) the feature opening being etched through a thickness of the DARC layer 16 overlying the IMD layer 12, to typically form closed communication with an underlying conductive area (not shown). Following anisotropic etching and removal of the photoresist layer (not shown) by a wet or dry ashing process, a barrier/adhesion layer 18, typically a refractory metal nitride such as tantalum nitride, is typically conformally deposited to line the feature opening 14 to prevent copper diffusion of subsequently electroplated copper into the IMD layer 12 to thereby undesirably alter the insulating characteristics of IMD layer 12.

Referring to FIG. 1C a copper layer 19 is typically electroplated onto a copper seed layer (not shown) deposited over the barrier/adhesion layer 18 to provide an electrical potential source for inducing electroplating of copper out of an electrolyte solution. Referring to FIGS. 1D or 1E, is shown the remaining metal filled semiconductor feature after carrying out a copper CMP process where, for example, the Cu CMP process underpolishes (FIG. 1D) by not entirely removing the DARC layer 16, and the barrier/adhesion layer 18 or overpolishes (FIG. 1E) by completely removing DARC layer 16, and the barrier/adhesion layer 18 including a portion of the IMD layer 12. Due to the relatively high polishing rates (e.g., greater than 500 Angstrom/min) of the DARC layer 16 and the barrier/adhesion layer 18, endpoint control of the Cu CMP polishing process is difficult to achieve, resulting in either underpolishing (e.g., FIG. 1D) by leaving remaining unpolished portions of DARC layer 16 and barrier/adhesion layer 18 or overpolishing (e.g., FIG. 1E) by excessive removal of IMD layer 12 resulting in semiconductor feature thickness outside of design specification.

Therefore, there is a need in the semiconductor processing art to develop a method whereby metal filled semiconductor features may be formed to improve a subsequent chemical mechanical polishing step.

It is therefore an object of the invention to provide a method whereby metal filled semiconductor features may be formed to improve a subsequent chemical mechanical polishing step while overcoming other deficiencies and shortcomings of the prior art.

SUMMARY OF THE INVENTION

To achieve the foregoing and other objects, and in accordance with the purposes of the present invention, as embodied and broadly described herein, the present invention provides a method for forming a metal filled semiconductor feature including a low dielectric constant CMP polishing stop layer for improving a CMP polishing process.

In a first embodiment of the invention, the method includes providing a semiconductor processing surface having a anisotropically etched semiconductor feature formed through a thickness including a second dielectric insulating layer overlying a first dielectric insulating layer, the second dielectric insulating layer having a CMP material removal rate in a CMP process less than about ½ of a CMP material removal rate of the first dielectric insulating layer in the CMP process; filling the anisotropically etched semiconductor feature with a metal to form a metal filled semiconductor feature; and, planarizing according to the CMP process excess material including the metal overlying the second dielectric insulating layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of copper filled semiconductor features it will be appreciated that the method of the present invention may be advantageously used with the formation of any metal filled semiconductor device where it would be advantageous to achieve better control over the metal removal rate in a CMP polishing step including dielectric layers overlying a metal filled semiconductor device. In addition, although the method of the present invention is explained with reference to a single damascene feature, for example a metal filled trench, it will be appreciated that the method of the present invention is easily adaptable to any metal filled damascene interconnect feature including for example, vias, contact holes, and dual damascene structures as well as larger features such as bonding or contact pads. By use of the term "copper" herein is included copper or alloys thereof.

In a first embodiment of the present invention, an anisotropically etched opening for forming a metal filled semiconductor feature is provided in a semiconductor wafer process surface the anisotropically etched opening formed in a first dielectric insulating layer including an overlying second dielectric insulating layer having a CMP material removal rate less than about one half of a CMP material removal rate of the first dielectric insulating layer in a CMP process.

In another embodiment, the second dielectric insulating layer preferably has a dielectric constant not greater than the first dielectric constant insulating layer, preferably lower than the first dielectric constant insulating layer. Preferably, the second dielectric insulating layer has a dielectric constant less than about 3.0, more preferably less than about 2.8.

In another embodiment, the second dielectric insulating layer has a CMP removal rate about one half to about ⅒ of the CMP material removal rate of the first dielectric insulating layer in the CMP process. Preferably, the CMP material removal rate for the second dielectric insulating layer in the CMP process is less than about 100 Angstroms per minute.

In another embodiment, preferably the second dielectric insulating layer is formed of a fluorinated amorphous carbon (FAC) layer having about 40 to about 60 percent by weight fluorine. Preferably, the fluorinated amorphous carbon layer is formed by reacting, ozone, tri-methyl-silane and a fluorine containing gas in a chemical vapor deposition process at a pressure of about 1 milliTorr to about 500 milliTorr and a temperature of about 30 to 400° C.

In another embodiment, the second insulating dielectric layer is formed having a thickness of about 50 to about 300 Angstroms, more preferably, about 150 Angstroms in thickness.

Figure 1A:
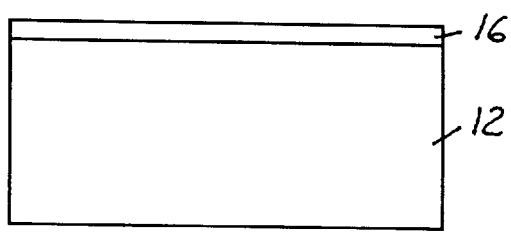
FIGS. 1A–1E are representative cross sectional side view representations of portions of multilayer semiconductor device including a metal filled semiconductor feature at stages in a manufacturing process according to the prior art.
Figure 1B:
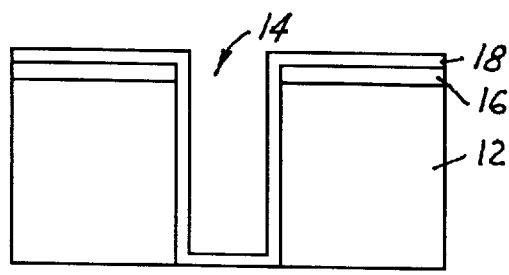
Figure 1C:
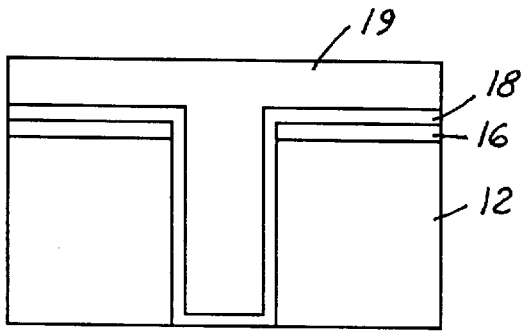
Figure 1D:
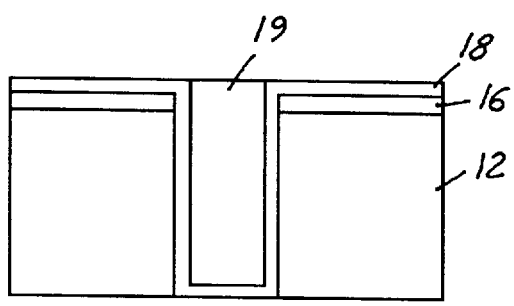
Figure 1E:
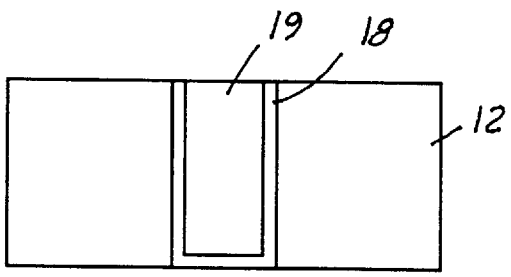
Figures 2A, 2B:
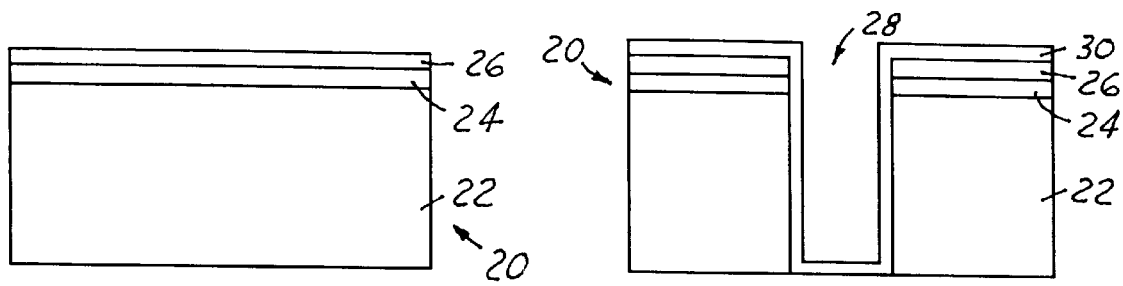
FIGS. 2A–2D are representative cross sectional side view representations of portions of multilayer semiconductor device at stages in a manufacturing process according to the present invention.

Referring to FIGS. 2A–2D, in an exemplary embodiment of the present invention are shown a portion of a multi-level semiconductor feature at stages in manufacture of an exemplary copper-filled semiconductor feature, for example, a copper-filled-trench. Shown in FIG. 2A is a semiconductor process surface 20 having a first dielectric insulating layer 22, also referred to as an inter-metal dielectric (IMD) layer, for example, formed of a low-k (low dielectric constant, e.g., less than about 3.0) insulating material. There are several suitable low-k materials that may be used for forming the IMD layers including for example, carbon doped oxide and fluorinated silica glass (FSG).

Still referring to FIG. 2A, IMD layer 22 is formed by conventional methods including CVD processes including plasma enhanced CVD (PECVD), high density plasma CVD (HDP-CVD), or spin on methods where, for example, spin-on glass (SOG) is used to form the IMD layer. The IMD layer 22 is typically formed having a thickness of about 4000 Angstroms to about 9000 Angstroms.

Still referring to FIG. 2A, according to the present invention, a fluorinated amorphous carbon (FAC) layer 24 is deposited by a CVD process over the IMD layer 22 (first dielectric insulating layer) to form a second dielectric insulating layer 24 to act as a CMP polishing stop layer. In a preferable plasma enhanced deposition process for forming the fluorinated amorphous carbon layer 24, a plasma is produced in a reaction chamber by an external induction coil driven by a radio frequency power source at power levels between 1000 and 3000 Watts (W). It will be recognized by those skilled in the art that alternative ion sources can be used in place of an RF driven induction coil. For example, an electron cyclotron resonance source, microwave tuned cavity, or helicon wave plasma source can be used to generate a plasma. Preferably, a radio frequency bias of up to 3500 W is optionally applied to the wafer. Deposition is performed at temperatures between 30 and over 400° C. More preferably, deposition is performed at high temperatures, for example, about 300 to about 400° C. The deposition pressure is preferably between about 1 and 500 mTorr.

For example, the fluorinated amorphous carbon layer 24 is preferably deposited according to a plasma enhanced CVD process by reacting oxygen and tri-methyl-silane together with a fluorocarbon or fluorine containing gas including at least one of $CF_4$, $CHF_3$, $C_2F_6$, $C_3F_6$, $C_3F_8$, $C_4F_8$, and hexafluorobenzene ($C_6F_6$), including combinations thereof.

Preferably, the oxygen is supplied by ozone ($O_3$), including a gas mixture or separate gases supplied to have an oxygen to tri-methyl silane to fluorine containing gas ratio of about 1:1:1 including an inert carrier gas, for example, helium, to adjust the relative ratios. Preferably, the fluorinated amorphous carbon layer is formed having a fluorine atomic percent of about 40 to about 60 atomic percent. For example, the fluorinated amorphous carbon layer is formed by a CVD process including an HDP-CVD or PECVD process. Preferably, the fluorinated amorphous carbon layer is deposited to having thickness of about 50 Angstroms to about 300 Angstroms, more preferably, about 150 Angstroms.

In one embodiment, the fluorinated amorphous carbon layer (second dielectric insulating layer) has a CMP removal rate in a Cu CMP process of less than about 100 Angstroms per minute which can be contrasted with a material removal rate of about 1000 Angstroms per minute in the Cu CMP process for the first dielectric insulating layer formed of, for example, fluorinated silica glass (FSG).

Still referring to FIG. 2A, following deposition of the second dielectric insulating layer 24 according to the present invention, a dielectric anti-reflectance coating (DARC) layer 26 is deposited over the second dielectric insulating layer 24 (CMP polishing stop layer) to reduce undesired light reflections in the subsequent photolithographic patterning step to define a trench opening. Preferably the DARC layer is formed of silicon oxynitride by a LPCVD or PECVD process. The thickness of the DARC layer may range from about 200 Angstroms to about 1000 Angstroms.

Referring to FIG. 2B, a trench opening 28 is typically formed after photolithographically patterning the trench opening and anisotropically etching the trench opening 28 by a conventional anisotropic plasma etching processes, for example, including fluorocarbon etching gases. The trench opening 28 is typically anisotropically etched to form closed communication with an underlying electrically conductive feature (not shown).

Still referring to FIG. 2B, in one embodiment of the present invention, a barrier/adhesion layer 30 is conformally deposited over the trench opening 28 by a conventional CVD process including for example, LPCVD, PECVD. The barrier/adhesion layer 30 is preferably at least one of a refractory metal and refractory metal nitride refractory metal. For example, a refractory metal may first be deposited by a physical vapor (PVD) deposition process optionally followed by a gaseous nitridization process to form a refractory metal nitride, the method well known in the art. Preferably, the refractory metal includes at least one of tantalum, titanium, tungsten, and the refractory metal nitride, nitrides thereof, for example TaN, TiN, and WN. The barrier/adhesion layer 30 is preferably formed having a thickness between about 25 Angstroms and about 500 Angstroms, more preferably, about 50 Angstroms to about 100 Angstroms.

Figures 2C, 2D:
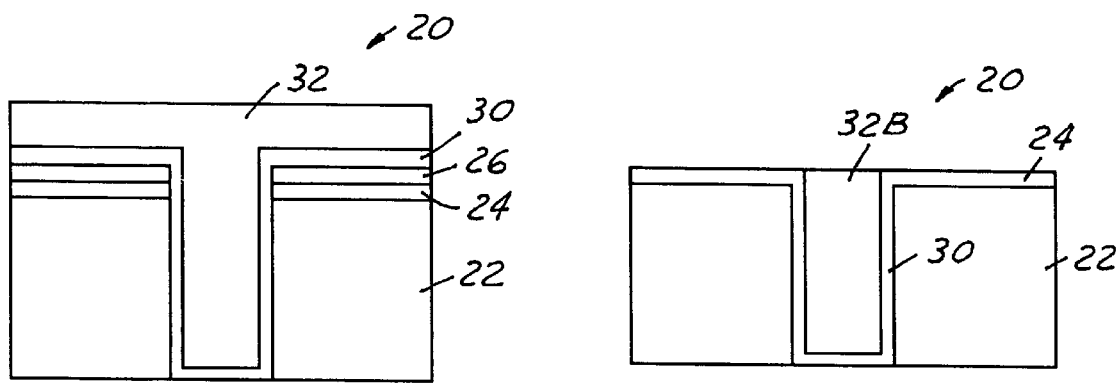

Referring to FIG. 2C, following formation of the barrier/adhesion layer 30, trench opening 28 is filled with metal, for example, copper to form copper layer 32. Although there are various methods for filling the trench opening 28 with copper including for example, PVD, CVD, and electrodeposition, an electrodeposition method, while not necessary for the practice of the present invention, is preferred.

Still referring to FIG. 2C, in order to carry out an electrodeposition process to fill the trench opening with metal, a metal seed layer(not shown), for example copper, is first conformally deposited into the trench opening 28 followed by an electrodeposition process, for example electroplating to electroplate (blanket deposit) copper layer 32 to fill the trench opening 28. For example, the copper seed layer (not shown) is deposited by CVD or PVD over the barrier/adhesion layer 30. The seed layer provides good adhesion and an electrically conductive layer for a cathodic reaction in the electroplating process where copper ions in an electroplating solution (electrolyte) are plated out of solution onto the seed layer to form copper layer 32.

Referring to FIG. 2D, following copper filling of the trench opening 30 to form copper layer 32, a conventional copper CMP process is carried out to remove excess copper in copper layer 32 overlying second dielectric insulating layer 24 and to planarize the copper filled trench opening 32B. In the process, the barrier/adhesion layer 30 and DARC layer 26 are also removed above second dielectric insulating layer 24 to form a planar surface defining the copper filled trench 32B. According to the present invention, the addition of the second dielectric insulating layer 24 (CMP polishing stop layer) having a CMP material removal rate less than about ½ of the CMP material removal rate of the IMD layer 22, allows improved control over the Cu CMP polishing process, allowing complete removal of the overlying higher dielectric constant DARC layer 26 and barrier/adhesion layer 30 while avoiding overpolishing of the IMD layer 22. For example, referring to FIG. 2D, preferably, a portion of the second dielectric insulating layer 24 remains overlying the IMD layer 22 following the Cu CMP process to remove excess copper and overlying DARC and barrier/adhesion layers.

Figure 3:
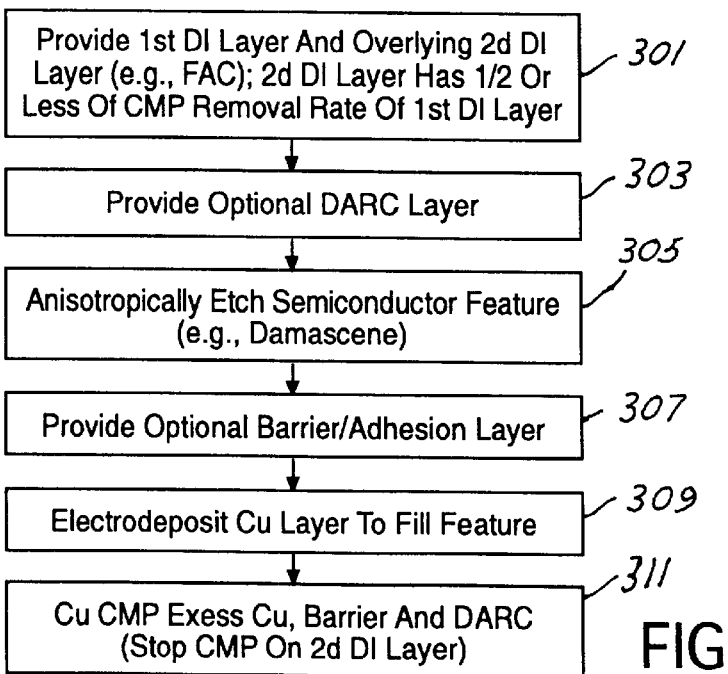
FIG. 3 is a representative process flow diagram including several embodiments of the method according to the present invention.

Referring to FIG. 3 is a process flow diagram including several embodiments of the present invention. In process 301 a first dielectric insulating layer (DI layer) having an overlying second dielectric insulating layer (e.g., fluorinated amorphous carbon) having a CMP material removal rate less than about ½ of the first dielectric insulating layer in a CMP process is provided for forming an anisotropically etched semiconductor feature opening for filling with metal.

In process 303, an overlying DARC layer, e.g., SiON is provided over the second dielectric insulating layer for photolithographically patterning a semiconductor feature opening.

In process 305, a semiconductor feature (e.g., a damascene feature, e.g., a trench opening) is anisotropically etched through a thickness including the second dielectric insulating layer overlying the first dielectric insulating layer (IMD layer) layer.

In process 307, an optional barrier/adhesion layer including at least one of a refractory metal and refractory metal nitride is conformally deposited over the anisotropically etched semiconductor feature opening.

In process 309 an electrodeposition process including electroplating a copper layer onto a copper seed layer deposited over the barrier adhesion is carried out to conformally deposit a copper filling to fill the anisotropically etched semiconductor feature.

Following copper filling of the semiconductor feature in process 309, a copper CMP process is carried out in process 311 to remove excess copper above the second dielectric insulating layer (CMP polishing stop layer) of the present invention including intervening DARC layers and barrier/adhesion layers to stop the CMP process on the second dielectric insulating layer.

Thus, a method has been presented for improving a chemically mechanical polishing process of a metal filled semiconductor feature by providing a CMP polish stop layer having a lower CMP material removal rate compared to an underlying IMD layer, and preferably having a dielectric constant not greater than the IMD layer, thereby allowing complete removal of overlying copper and high dielectric constant layers including DARC and barrier/adhesion layers while avoiding overpolishing the IMD layer. As a result, overall contributions to capacitance in multilevel semiconductor devices are reduced while design specifications for metal filled semiconductor features are maintained.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a metal filled semiconductor feature including a low dielectric constant CMP polishing stop layer for improving a CMP polishing process comprising the steps of:

providing a semiconductor processing surface having a anisotropically etched semiconductor feature opening formed through a thickness including a fluorinated amorphous carbon second dielectric insulating layer overlying a first dielectric insulating layer, the fluorinated amorphous carbon second dielectric insulating layer having a CMP material removal rate in a CMP process less than about ½ of a CMP material removal rate of the first dielectric insulating layer in the CMP process;

filling the anisotropically etched semiconductor feature opening with a metal to include covering the fluorinated amorphous carbon second dielectric insulating layer; and, removing according to the CMP process excess material above the opening level including the metal covering the fluorinated amorphous carbon second dielectric insulating layer.

2. The method of claim 1, wherein the fluorinated amorphous carbon second dielectric insulating layer has a dielectric constant less than or equal to the first dielectric insulating layer.

3. The method of claim 2, wherein the first dielectric insulating layer and the fluorinated amorphous carbon second dielectric insulating layer have a dielectric constant of less than about 3.0.

4. The method of claim 1, wherein the fluorinated amorphous carbon second dielectric insulating layer is formed having a fluorine content of about 40 to about 60 atomic percent.

5. The method of claim 4, wherein the fluorinated amorphous carbon is formed according to chemical vapor deposition (CVD) process including tri-methyl silane, oxygen, and a fluorine containing gas.

6. The method of claim 4, wherein the fluorine containing gas includes at least one of $CF_4$, $CHF_3$, $C_2F_6$, $C_3F_6$, $C_3F_8$, $C_4F_8$, and $C_6F_6$.

7. The method of claim 5, wherein the CVD process includes one of a plasma enhanced CVD process and a high density plasma CVD process.

8. The method of claim 4, wherein the fluorinated amorphous carbon second insulating dielectric layer is formed having a thickness of from about 50 Angstroms to about 300 Angstroms.

9. The method of claim 1, wherein the step of providing includes providing the anisotropically etched semiconductor feature opening formed through the thickness to include a dielectric anti-reflectance coating (DARC) layer comprising one of silicon oxynitride and titanium nitride overlying the second dielectric insulating layer.

10. The method of claim 1, further including the step of depositing a barrier/adhesion layer including one of a refractory metal and refractory metal nitride prior to the step of filling the anisotropically etched semiconductor feature opening with a metal.

11. The method of claim 10, further including the step of depositing a seed layer of the metal layer prior to the step of filling the anisotropically etched semiconductor feature opening with a metal.

12. The method of claim 11, wherein the metal comprises copper or an alloy thereof and the step of filling comprises an electrodeposition process.

13. The method of claim 1, wherein the fluorinated amorphous carbon second dielectric insulating layer has a CMP material removal rate in the CMP process from about 1/10 to about ½ of a CMP material removal rate of the first dielectric insulating layer in the CMP process.

14. The method of claim 1, wherein the fluorinated amorphous carbon second dielectric insulating layer has a CMP material removal rate in the CMP process of less than 100 Angstroms per minute.

15. A method for forming a copper filled semiconductor feature including a CMP polishing stop layer for improving a CMP polishing process comprising the steps of:

providing a semiconductor processing surface having a anisotropically etched semiconductor feature opening formed through a thickness portion including an uppermost anti-reflectance layer overlying a fluorinated amorphous carbon dielectric insulating layer overlying a first dielectric insulating layer, the fluorinated amorphous carbon dielectric insulating layer having a CMP material removal rate in a CMP process less than about ½ of a CMP material removal rate of the first dielectric insulating layer in the CMP process;

filling the anisotropically etched semiconductor feature opening according to an electrodeposition process with copper to include covering the uppermost anti-reflectance layer; and, planarizing according to the CMP process including removing material layers overlying the fluorinated amorphous carbon dielectric insulating layer to stop the CMP process on the fluorinated amorphous carbon dielectric insulating layer.

16. The method of claim 15, wherein the first dielectric insulating layer and the fluorinated amorphous carbon dielectric insulating layer have a dielectric constant of less than about 3.0.

17. The method of claim 15, wherein the fluorinated amorphous carbon dielectric insulating layer is formed having a fluorine content of about 40 to about 60 atomic percent.

18. The method of claim 17, wherein the fluorinated amorphous carbon is formed according to chemical vapor deposition (CVD) process including tri-methyl silane, oxygen, and a fluorine containing gas including at least one of $CF_4$, $CHF_3$, $C_2F_6$, $C_3F_6$, $C_3F_8$, $C_4F_8$, and $C_6F_6$.

19. The method of claim 15, wherein the fluorinated amorphous carbon dielectric insulating layer is formed having a thickness of from about 50 Angstroms to about 300 Angstroms.

20. The method of claim 15, wherein the fluorinated amorphous carbon dielectric insulating layer has a CMP material removal rate in the CMP process from about 1/10 to about ½ of a CMP material removal rate of the first dielectric insulating layer in the CMP process.

* * * * *